(12) United States Patent
Huang et al.

(10) Patent No.: US 8,379,183 B2
(45) Date of Patent: Feb. 19, 2013

(54) LCOS DISPLAY UNIT AND METHOD FOR FORMING THE SAME

(75) Inventors: Herb He Huang, Shanghai (CN); Xianyong Pu, Shanghai (CN); Jianhong Mao, Shanghai (CN); Yiqun Chen, Shanghai (CN); Jing Fu, Shanghai (CN); Zhongshan Hong, Shanghai (CN); Yanghui Xiang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 8 days.

(21) Appl. No.: 13/155,870

(22) Filed: Jun. 8, 2011

(65) Prior Publication Data

US 2011/0237009 A1     Sep. 29, 2011

Related U.S. Application Data

(62) Division of application No. 11/851,331, filed on Sep. 6, 2007, now Pat. No. 7,995,165.

(30) Foreign Application Priority Data

Dec. 4, 2006 (CN) .......................... 2006 1 0119059

(51) Int. Cl.
*G02F 1/13* (2006.01)
*G02F 1/1335* (2006.01)

(52) U.S. Cl. ............. 349/187; 438/30; 349/42; 349/43; 349/44; 349/111; 349/113; 349/138

(58) Field of Classification Search .................. 349/113, 349/187, 42, 43, 44, 110, 111, 138; 257/E31.127; 438/29, 30
See application file for complete search history.

(56) References Cited

U.S. PATENT DOCUMENTS

| | | | | |
|---|---|---|---|---|
| 4,572,615 A | * | 2/1986 | Nickol et al. | 349/138 |
| 5,436,188 A | * | 7/1995 | Chen | 438/397 |
| 6,069,405 A | * | 5/2000 | Stockton | 257/758 |
| 6,100,947 A | * | 8/2000 | Katayama | 349/38 |
| 6,437,839 B1 | * | 8/2002 | Cacharelis | 349/39 |
| 6,628,358 B1 | * | 9/2003 | Colson | 349/114 |
| 6,686,977 B2 | * | 2/2004 | Smith et al. | 349/43 |
| 6,797,983 B2 | * | 9/2004 | Chen et al. | 257/59 |
| 6,992,718 B1 | * | 1/2006 | Takahara | 348/333.09 |
| 7,030,952 B2 | * | 4/2006 | Chang et al. | 349/139 |
| 2003/0183863 A1 | * | 10/2003 | Nakao et al. | 257/307 |
| 2004/0095540 A1 | * | 5/2004 | Iwasa et al. | 349/137 |
| 2004/0114075 A1 | * | 6/2004 | Iwasa | 349/113 |
| 2006/0215068 A1 | * | 9/2006 | Nakagawa | 349/38 |
| 2006/0261432 A1 | * | 11/2006 | Yoshimura et al. | 257/462 |

FOREIGN PATENT DOCUMENTS

CN          1725068 A          1/2006

* cited by examiner

*Primary Examiner* — Brian Healy
*Assistant Examiner* — Peter Radkowski
(74) *Attorney, Agent, or Firm* — Squire Sanders (US) LLP

(57) ABSTRACT

An embodiment of the present invention discloses a Liquid Crystal on Silicon (LCOS) display unit, in which a Metal-Insulator-Metal (MIM) capacitor consisting of a micromirror layer, a insulation layer and a light shielding layer is formed by grounding the light shielding layer on a pixel switch circuit layer. Therefore the pixel switch circuit and the capacitor are in vertical distribution, that is, the switch circuit and the capacitor both have an allowable design area of the size of one pixel. Another embodiment of the present invention provides a method for forming a Liquid Crystal on Silicon (LCOS) display unit.

13 Claims, 6 Drawing Sheets

LCOS DISPLAY UNIT AND METHOD FOR FORMING THE SAME

CROSS-REFERENCE TO RELATED APPLICATION

This application is a divisional of prior application Ser. No. 11/851,331, filed Sep. 6, 2007, the entire disclosure of which is hereby incorporated by reference.

FIELD OF THE PRESENT INVENTION

The present invention relates to semiconductors, and more particularly, to a Liquid Crystal on Silicon (LCOS) display unit and a method for forming the same.

BACKGROUND OF THE PRESENT INVENTION

In recent years, many new technologies related to Liquid Crystal Displays (LCD) have come forth, and among others, Liquid Crystal on Silicon (LCOS) is a hot technology. LCOS relates to a new reflective micro LCD projection technology. To form an LCOS structure, transistors are grown on a silicon substrate; a drive panel (also referred to as Complementary Metal-Oxide-Semiconductor-LCD (CMOS-LCD)) is fabricated using a semiconductor process; the transistors are flattened by polishing technology and plated with aluminum to act as micro mirrors; thus a Complementary Metal-Oxide-Semiconductor (CMOS) substrate is formed; then the CMOS substrate is jointed with an upper glass substrate having transparent electrodes, and liquid crystal is injected into the structure. An encapsulation test is then performed.

Compared with conventional LCD and Digital Light Processing (DLP) technologies, LCOS has the following technical advantages: a) high light utilization efficiency: LCOS is similar to LCD technology, and mainly different from LCD in that LCOS is a reflective imaging system, such that the light utilization efficiency may reach 40% or more which is equivalent to the light utilization efficiency of DLP, while the light utilization efficiency of transmissive LCD only reaches about 3%; b) small volume: LCOS may integrate periphery circuits such as driver ICs to a CMOS substrate completely, so as to reduce the number of periphery ICs and the encapsulation cost, and decrease the whole volume; c) high resolution: since the transistor and the driver circuits of an LCOS are both fabricated in a silicon substrate and located under the reflective surface, they don't occupy surface area, and only pixel gaps occupy opening area, while Thin Film Transistors (TFTs) and wires of a transmissive LCD both occupy the opening area, so that both the resolution and the opening ratio of LCOS are higher than those of transmissive LCD; d) more mature manufacturing technology: the manufacturing of LCOS may be divided into Front of Line (FL) semiconductor CMOS manufacturing and End of Line (EL) liquid crystal panel jointing and encapsulating. There have been mature designing, simulating, fabricating and testing technologies for the FL semiconductor CMOS manufacturing, and now the product yield has reached above 90% with a very low cost; as for the EL liquid crystal panel jointing and encapsulating, although the yield is only 30% at now, since the manufacturing of liquid crystal panel has been developed rather maturely, the yield may be increased more rapidly than that of digital micromirror device (DMD) in theory. As a result, LCOS has more chances to be the mainstream technology than DLP. Therefore, LCOS technology has a bigger potential in application markets of digital camera, digital video camera, projector, monitor, large size TV and mobile telephone.

In LCOS technology, each pixel switch circuit consists of a Metal-Oxide-Semiconductor Field-Effect Transistor (MOSFET) and a capacitor. In conventional processes, the capacitor occupies half of the whole pixel area. As the circuit area decreases, the capacitor area also decreases. This will increase refresh rate in practical use. In order to increase capacitance, U.S. Pat. No. 6,437,839 discloses an LCOS pixel with multiple capacitors, the structure of which is shown in FIG. 1, and formed by the following steps: a diffusion region is formed on a substrate 40 as a top electrode of a first capacitor; an oxide layer is formed on the diffusion region as a dielectric layer 22b of the first capacitor; a first polysilicon layer 26 is formed on the dielectric layer 22b as a common electrode of two capacitors; a second oxide layer is formed on the first polysilicon layer 26 as a dielectric layer 24b of a second capacitor; a second polysilicon layer is formed on the second oxide layer as a top electrode 24a of the second capacitor; an insulation layer 42 is formed on the above structure; and an interconnection structure and an micromirror layer is formed on the above structure. As shown in FIG. 1, the capacitance is increased in the improved structure, but the processes are also increased, resulting in increased processing cost.

At present, each micromirror on the substrate surface serves as a display pixel, and each display pixel has a switch circuit. A pixel switch (MOSFET) and a capacitor must be designed in the area of a pixel. In order to lower the display refresh rate, the capacitance needs to be as large as possible. However, as restricted by the pixel area, if the capacitor occupies the pixel area in too high proportion, the performance of the switch circuit may be affected inevitably. For example, since the design area of the MOSFET is decreased, the insulation performance of the MOSFET may be affected and current leakage may occur.

SUMMARY OF THE PRESENT INVENTION

The present invention aims to solve the following problems: as higher and higher resolution is required for a display, the area of each pixel is becoming smaller and smaller; as restricted by the pixel area, it is difficult to obtain a pixel switch circuit with high performance and hold a high capacitor voltage level at the same time.

In an aspect of the present invention, there is provided a Liquid Crystal on Silicon (LCOS) display unit, which includes: a silicon substrate; a pixel switch circuit layer on the silicon substrate, the pixel switch circuit layer including a Metal-Oxide-Semiconductor Field Effect Transistor (MOSFET); a light shielding layer on the pixel switch circuit layer; an insulation layer on the light shielding layer; a micromirror layer on the insulation layer, the micromirror layer, the insulation layer and the light shielding layer constituting a capacitor, and the micromirror layer being electrically connected with a source of the MOSFET, wherein the light shielding layer is grounded.

Optionally, a mirror connecting pad is formed in the light shielding layer to be isolated from the light shielding layer; and the mirror connecting pad is electrically connected with the source of the MOSFET.

Optionally, an opening is formed in the insulation layer; and the opening is filled with a conductive material which electrically connects the micromirror layer to the mirror connecting pad.

Optionally, the light shielding layer is electrically connected with a ground pad via a through hole of the pixel switch circuit layer; and the ground pad is grounded.

Optionally, the insulation layer has a thickness ranging from 100 Å to 1000 Å.

Optionally, the insulation layer is made of silicon oxide, silicon nitride, silicon oxynitride, hafnium oxide, aluminum oxide, zirconium oxide or a combination thereof.

Optionally, the micromirror layer is made of aluminum.

Optionally the light shielding layer is made of metallic titanium, titanium nitride, AlCu alloy, titanium nitride or a combination thereof.

In another aspect of the present invention, there is provided a method for forming a Liquid Crystal on Silicon (LCOS) display unit, which includes: forming a pixel switch circuit layer on a silicon substrate, the pixel switch circuit layer including a Metal-Oxide-Semiconductor Field Effect Transistor (MOSFET); forming a light shielding layer on the pixel switch circuit layer; forming an insulation layer on the light shielding layer; forming a micromirror layer on the insulation layer; the micromirror layer, the insulation layer and the light shielding layer constituting a capacitor, and the micromirror layer being electrically connected with a source of the MOSFET, wherein the light shielding layer is grounded.

Optionally, the method further includes forming in the light shielding layer a mirror connecting pad to be isolated from the light shielding layer, wherein the mirror connecting pad is electrically connected with the source of the MOSFET.

Optionally, the method further includes forming an opening in the insulation layer and filling the opening with a conductive material, wherein the conductive material electrically connects the micromirror layer to the mirror connecting pad.

Optionally, the light shielding layer is electrically connected to a ground pad via a through hole in the pixel switch circuit layer; and the ground pad is grounded.

Optionally, the insulation layer has a thickness ranging from 100 Å to 1000 Å.

Optionally, the insulation layer is made of silicon oxide, silicon nitride, silicon oxynitride, hafnium oxide, aluminum oxide, zirconium oxide or a combination thereof.

Optionally, the micromirror layer is made of aluminum.

Optionally, the light shielding layer is made of metallic titanium, titanium nitride, AlCu alloy, titanium nitride or a combination thereof.

Compared with the prior art, the present invention has the following advantages: a Metal-Insulator-Metal (MIM) capacitor consisting of a micromirror layer, a insulation layer and a light shielding layer is formed by grounding the light shielding layer on a pixel switch circuit layer. Therefore the pixel switch circuit and the capacitor are in vertical distribution, that is, the switch circuit and the capacitor both have an allowable design area of the size of one pixel. Thus, the present invention makes full use of the area of the whole pixel, increases the capacitance and decreases the refresh rate of the LCOS display unit.

Additionally, the present invention also increases the design area of a switch circuit, and switch circuits with high performance may be designed according to different requirements, so that design flexibility of switch circuits may be increased.

The present invention also simplifies the procedure for manufacturing capacitors, thus decreasing the overall chip manufacturing cost.

DETAILED DESCRIPTION OF THE EMBODIMENTS

The above objects and advantages of the present invention will become more apparent with reference to the following description of the preferred embodiments given in conjunction with the accompanying drawings.

A method for forming a Liquid Crystal on Silicon (LCOS) display unit is now described, which includes: forming a pixel switch circuit layer on a silicon substrate, the pixel switch circuit layer including a Metal-Oxide-Semiconductor Field-Effect Transistor (MOSFET); forming a light shielding layer on the pixel switch circuit layer; forming an insulation layer on the light shielding layer; forming a micromirror layer on the insulation layer; wherein the micromirror layer, the insulation layer and the light shielding layer constitute a capacitor, the micromirror layer is electrically connected with a source of the MOSFET, and the light shielding layer is grounded.

FIGS. 2A to 2J illustrating a method for forming an LCOS display unit according to an embodiment of the present invention. The embodiments of the present invention will be described hereunder in detail in conjunction with the drawings.

Figure 1:
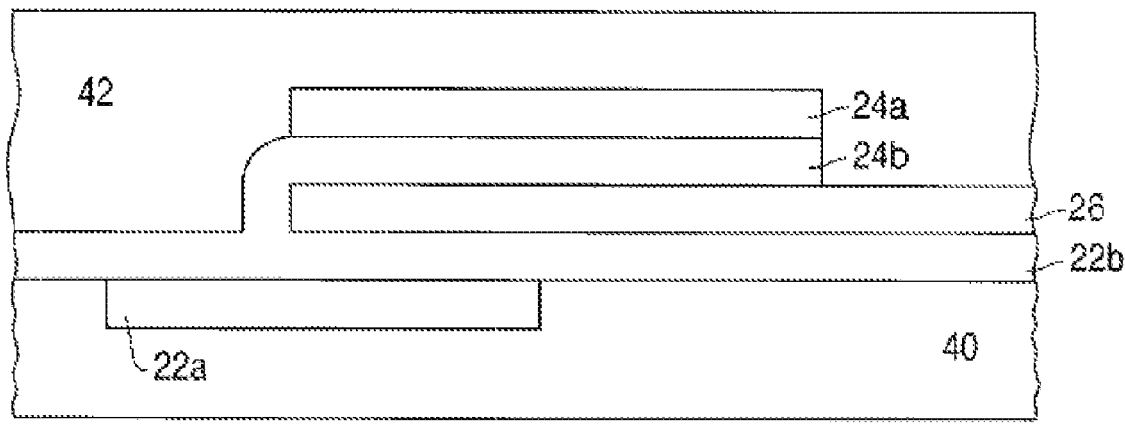
FIG. 1 is a schematic diagram illustrating the structure of a capacitor of a LCOS display unit in prior art.
Figure 2A:
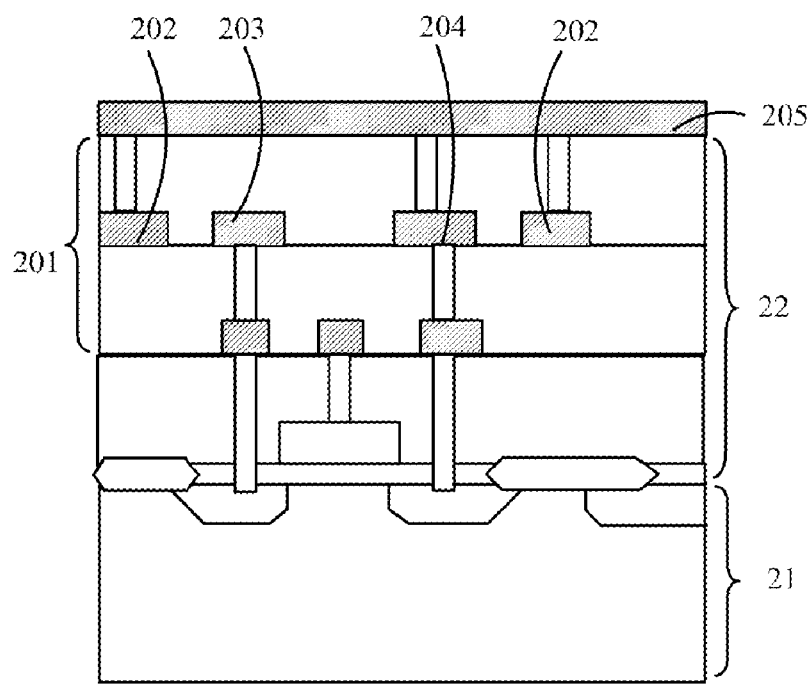
FIGS. 2A to 2K are schematic diagrams illustrating a method for forming an LCOS display unit according to an embodiment of the present invention.

Referring to FIG. 2A, first, a pixel switch circuit layer 22 including a Metal-Oxide-Semiconductor Field-Effect Transistor (MOSFET) is formed on a silicon substrate 21. The technology for forming the pixel switch circuit layer 22 is known to those skilled in the art. In a preferred embodiment of the present invention, the pixel switch circuit layer 22 includes an interlayer insulation layer 201, and ground pads 202, a signal pad 203, a connection pad 204 which are inserted in the interlayer insulation layer 201, as well as connection through holes. The ground pads 202 are connected to ground, the signal pad 203 is adapted to apply a voltage to the MOSFET of a drive circuit, the signal pad 203 is connected with a drain of the MOSFET of the pixel switch circuit layer 22 via a through hole, and a source of the MOSFET is electrically connected with the connection pad 204 via a through hole.

Then, a first conductive layer 205 is formed on the interlayer insulation layer 202. The first conductive layer 205 is made of single or multiple layers of conductive materials. In a preferred embodiment of the present invention, the first conductive layer 205 is a multi-layer structure consisting successively of metallic titanium, titanium nitride, AlCu alloy, titanium nitride and metallic titanium. Preferably, the first conductive layer 205 has a thickness ranging from 1000 Å to 6000 Å.

Figure 2B:
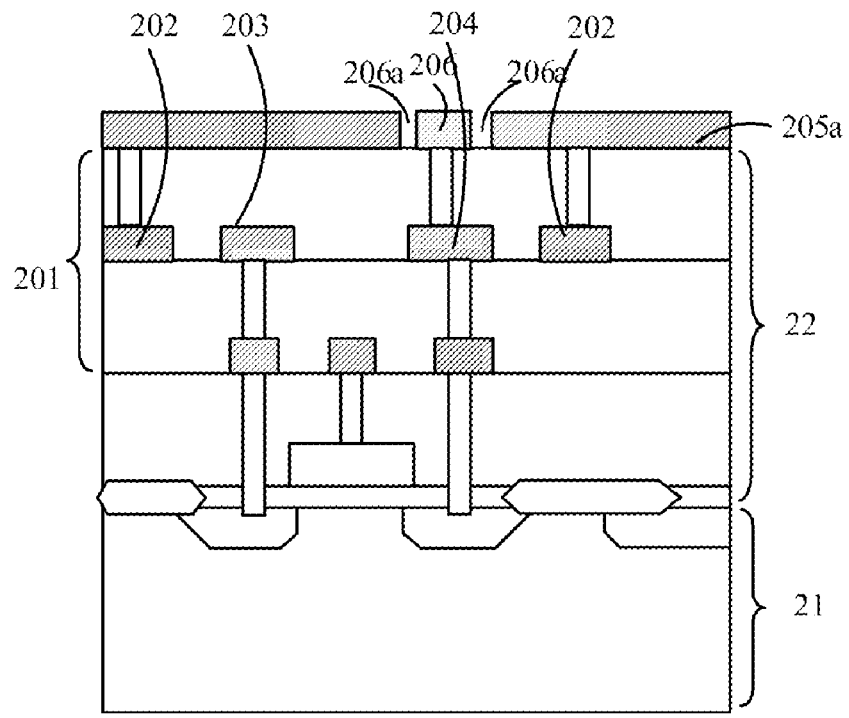

Referring to FIG. 2B, an island-like mirror connecting pad 206 and a light shielding layer 205a are formed in the first conductive layer 205 by the existing photolithography and etching technologies. The purpose for forming the light shielding layer 205a is to prevent the light from leaking onto the circuit devices in the silicon substrate. In case that the light leaks onto the circuit devices, it will affect the performance and life of the circuit, and thus a specific layer of metal is required to shield light. Gaps 206a between the mirror connecting pad 206 and the light shielding layer 205a insulatively isolate the mirror connecting pad 206 from the light shielding layer 205a. The mirror connecting pad 206 is electrically connected with the source of the MOSFET of the pixel switch circuit layer via the connection pad 204 and a through hole. The light shielding layer 205a is electrically connected with ground pads 202 via through holes in the pixel switch circuit layer 22. The ground pads 202 are grounded.

Figure 2C:
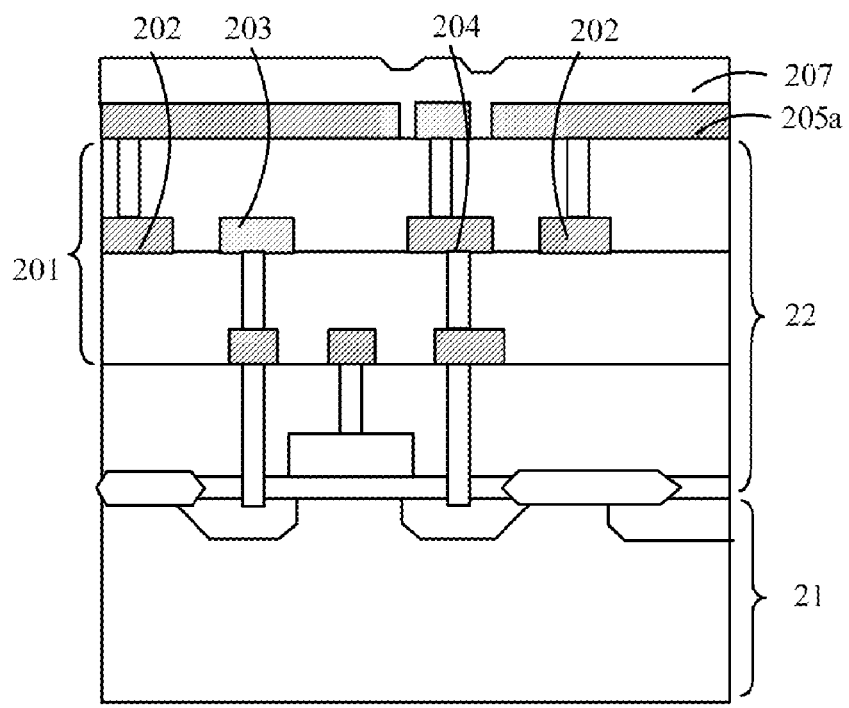

Referring to FIG. 2C, a silicon oxide layer 207 is form on the light shielding layer 205a and the mirror connecting pad 206 as well as in the gaps 206a by a high-density plasma chemical vapor deposition (CVD). Since the gaps 206a are filled, grooves are generated on the surface of the silicon oxide layer 207 toward the gaps 206a. The silicon oxide layer 207 formed has a thickness ranging from 200 nm to 1000 nm.

Figure 2D:
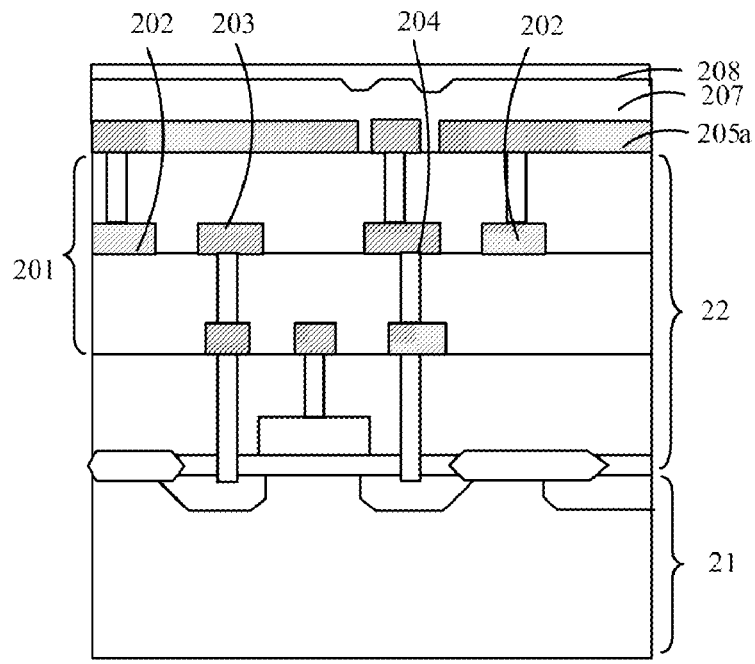

Referring to FIG. 2D, an organic Bottom Anti-Reflecting Layer (BARC) 208 is formed on the surface of the silicon oxide layer 207. The organic bottom anti-reflecting layer 208 has a good flowability and fills up the grooves on the surface of the oxide layer 207 completely. The purpose for forming the organic bottom anti-reflecting layer 208 is to fill the grooves on the surface of the silicon oxide layer 207 so as to protect the part of the silicon oxide towards the grooves and keep the surface flat after etching.

Figure 2E:
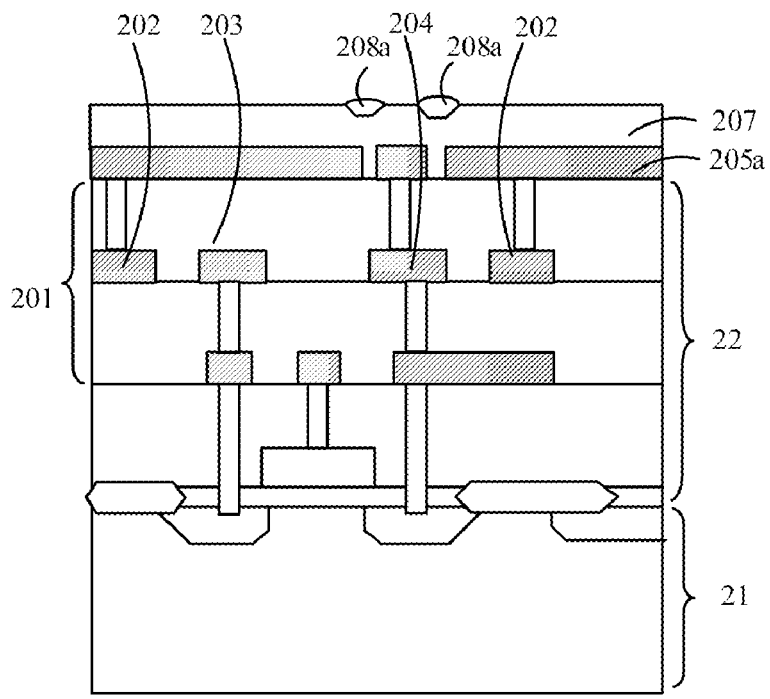

Referring to FIG. 2E, the organic bottom anti-reflecting layer 208 is removed. After the removing, the residual organic bottom anti-reflecting layer 208a fills up the grooves on the surface of the silicon oxide layer 207. The method for partially removing the organic bottom anti-reflecting layer 208 is well known to those skilled in the art. In a preferred embodiment of the present invention, $O_2$ plasma is employed to etch the organic bottom anti-reflecting layer 208, such that part of the organic bottom anti-reflecting layer 208 reacts with the $O_2$ plasma and generates gases such as $CO_2$ and $H_2O$, which escape from the surface of the silicon substrate.

Figure 2F:
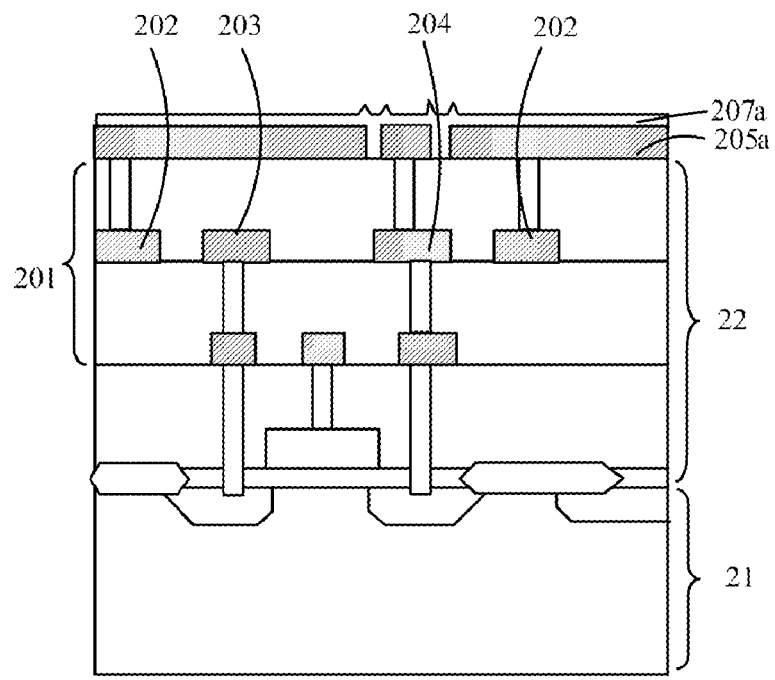

Referring to FIG. 2F, the silicon oxide layer 207 is removed. There is a residual silicon oxide layer 207a on the surfaces of the light shielding layer 205a and the mirror connecting pad 206 as well as in the gaps 206a. The technology for removing the silicon oxide layer 207 is well known to those skilled in the art. In a preferred embodiment of the present invention, dry etching is employed to etch the silicon oxide layer 207. After the silicon oxide layer 207 is removed, due to the inherent defect of the dry etching, bumps may be formed on the surface of the residual silicon oxide layer 207a at the gaps 206a. These bumps will cause unevenness of the finally generated micromirror which is covered with liquid crystal. If the surface of the micromirror is uneven, the liquid crystal orientation and the electric field applied to the liquid crystal will be affected, so that the display performance will be affected.

Figure 2G:
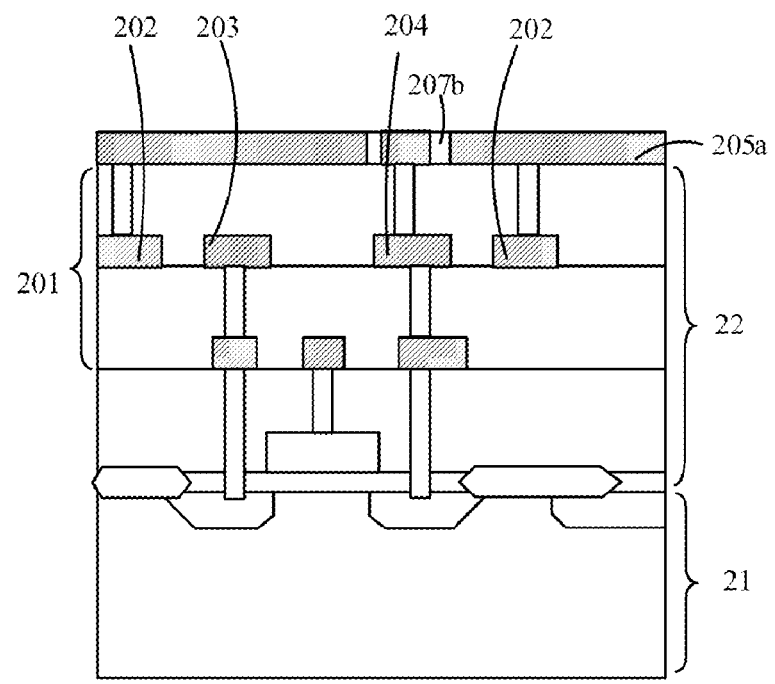

Referring to FIG. 2G, the surface of the residual silicon oxide layer 207a is planarized. During the planarization process, the residual silicon oxide layer 207a on the light shielding layer 205a is removed until the light shielding layer 205a is exposed. Thereafter, a smooth surface consisting of the light shielding layer 205a, the mirror connecting pad 206, and the silicon oxide 207b filled in the gaps 206a is formed. The technology for planarizing the surface of the residual silicon oxide layer 207a is well known to those skilled in the art. In a preferred embodiment of the present invention, the surfaces of the residual silicon oxide layer 207a and the light shielding layer 205a are polished simultaneously by a Chemical-Mechanical Polishing (CMP) device. Finally, a smooth, flat surface is formed.

Figure 2H:
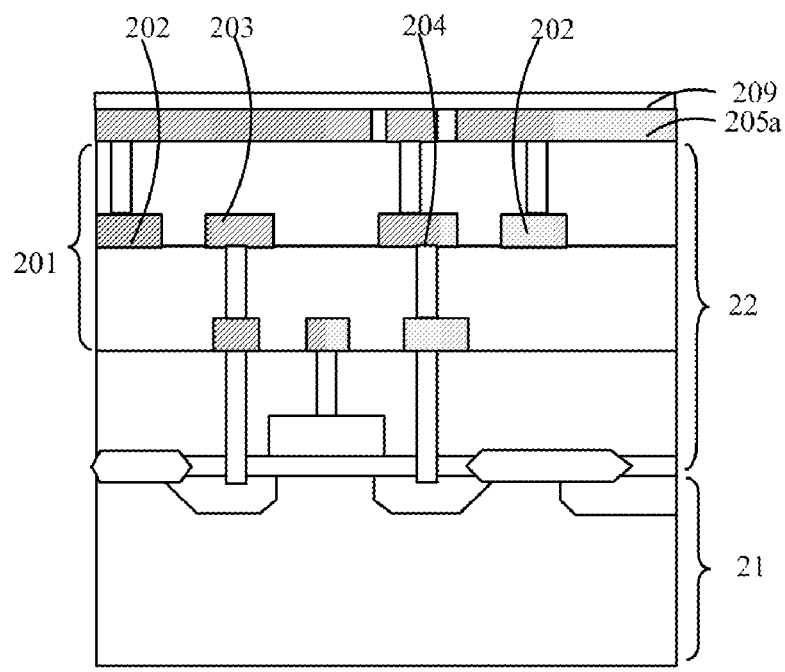

Referring to FIG. 2H, an insulation layer 209 is formed on the surfaces of the light shielding layer 205a, the mirror connecting pad 206 and the silicon oxide 207b filled in the gaps 206a. The insulation layer 209 may be made of silicon oxide, silicon nitride, silicon oxynitride or a combination thereof, and the insulation layer 209 may also be made of high-k dielectrics such as hafnium oxide, aluminum oxide, zirconium oxide and so on. In a preferred embodiment of the present invention, a three-layer ONO structure made of silicon oxide, silicon nitride and silicon oxide is used to serve as an insulation layer 209, and the insulation layer 209 has a thickness ranging from 100 Å to 1000 Å. The method for forming the insulation layer 209 is well known to those skilled in the art.

Figure 2I:
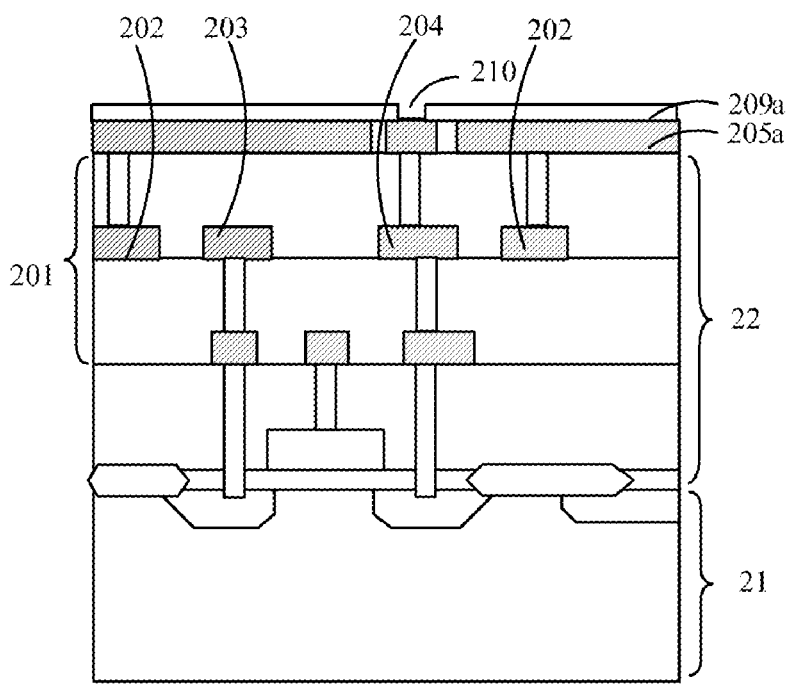

Referring to FIG. 2I, an opening 210 is formed on the insulation layer 209. The opening 210 exposes the mirror connecting pad 206. The method for forming the opening 210 is well known to those skilled in the art.

Figure 2J:
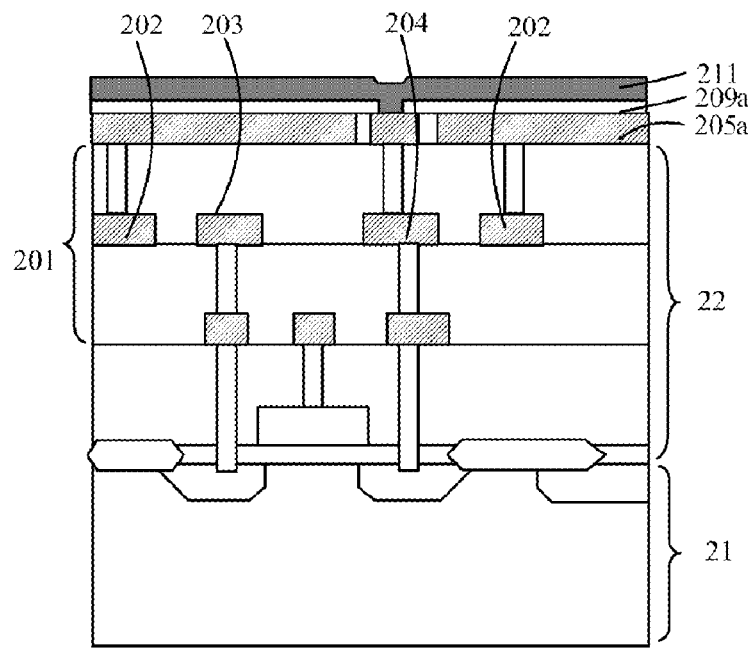

Referring to FIG. 2J, a metal layer 211 is formed on the insulation layer 209a and in the opening 210. The metallic material filled in the opening electrically connects the metal layer 211 with the mirror connecting pad 206. A metallic material with a high reflectivity which may be aluminum, silver or an alloy thereof is employed to form the metal layer 211. In a preferred embodiment of the present invention, the metal layer 211 is formed by using metallic aluminum. The metal layer 211 has a thickness ranging from 1000 Å to 6000 Å. Due to the existence of the opening, after the metal layer 211 is formed, a groove is formed on the surface of the metal layer 211 toward the opening 210, and the depth range of the groove is 100 Å to 200 Å.

Figure 2K:
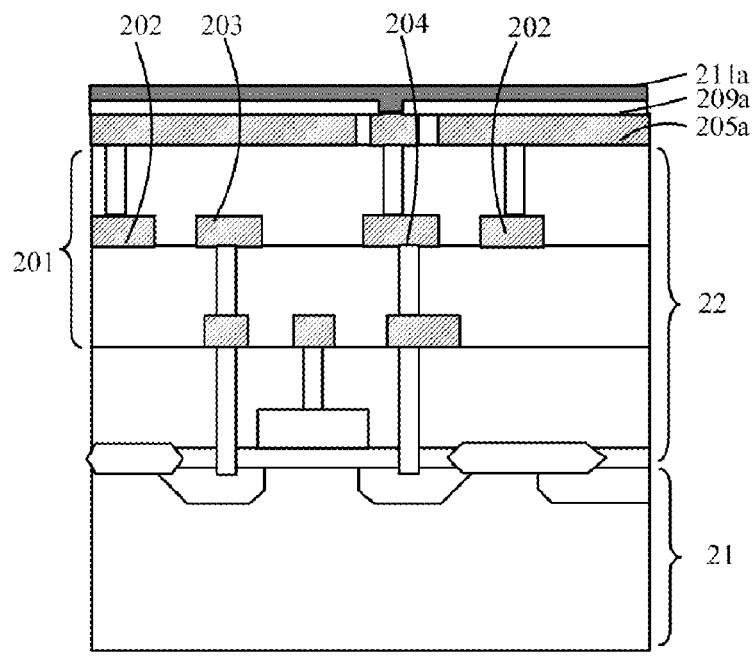

Referring to FIG. 2K, the metal layer 211 is planarized to form a micromirror layer 211a. The technology for planarizing the metal layer 211 is well known to those skilled in the art. In a preferred embodiment of the present invention, a Chemical-Mechanical Polishing (CMP) device is employed to planarize the surface of the metal layer 211, finally forming a smooth, flat micromirror layer 211a. The micromirror layer 211a has a thickness ranging from 800 Å to 5800 Å. The micromirror layer 211a is electrically connected with the mirror connecting pad 206 via the metal filled in the opening 210, so that the micromirror layer 211a is connected to the source of the MOSFET of the pixel switch circuit layer 22.

In an embodiment of the present invention, a structure of an LCOS display unit obtained based on the implementing of the above process is shown in FIG. 2K. The structure includes: a pixel switch circuit layer 22 formed on a silicon substrate 21, the pixel switch circuit layer 22 including a Metal-Oxide-Semiconductor field-effect transistor (MOSFET); a light shielding layer 205a on the pixel switch circuit layer 22; an insulation layer 209a on the light shielding layer 205a; a micromirror layer 211a on the insulation layer 209a. The micromirror layer 211a, the insulation layer 209a and the light shielding layer 205a constitute a capacitor, in which the micromirror layer 211a is electrically connected with a source of the MOSFET, and the light shielding layer 205a is grounded.

An island-like mirror connecting pad 206 insulated from the light shielding layer 205a is formed in the center of the light shielding layer 205a. The light shielding layer 205a is electrically connected with ground pads 202 in the pixel switch circuit layer 22, and the ground pads 202 are grounded; the mirror connecting pad 206 is electrically connected with a source of the MOSFET via a connection pad 204 formed in the pixel switch circuit layer 22; an opening 210 is formed in the insulation layer 209a, and the micromirror layer 211a is electrically connected with the mirror connecting pad 206 via a metallic material filled in the opening 210 which is the same as that of the micromirror layer 211a. The insulation layer 209a has a thickness ranging from 100 Å to 1000 Å.

As shown in FIG. 2K, the micromirror layer 211a, the insulation layer 209a and the light shielding layer 205a constitute a metal-insulator-metal (MIM) capacitor. The upper electrode (mirror 211a) of the capacitor is electrically connected with the source of the MOSFET, and the lower electrode (light shielding layer 205a) of the capacitor is electrically connected with the ground pads 202. Thus, the MOSFET and the capacitor constitute a dynamic random access memory (DRAM). When a voltage is applied on a gate of the MOSFET of the pixel switch circuit layer 22, the MOSFET is turned on, and since the upper electrode of the capacitor is electrically connected with the source of the MOSFET, the capacitor is charged via the voltage applied on the signal pad 203. The capacitor area is the area of the whole pixel, moreover the insulation layer 209a is thin thus the capacitance of the capacitor is increased, such that the refresh rate is decreased. The insulation layer 209a is thin, so the formed thickness of the opening 210 is small, and the contact resistance between the micromirror layer 211a and the mirror connecting pad 206 is decreased. At last, since the insulation layer 209a is thin, the probability of a light entering onto the silicon devices through diffuse reflection is reduce, and accordingly the light shielding is enhanced.

Additionally, according to the embodiments of the present invention, the design area of a switch circuit is also increased, and switch circuits with high performance may be designed according to different requirements, so that design flexibility of switch circuits may be increased. For example, a switch with a N-type Metal-Oxide-Semiconductor (NMOS) and a P-type Metal-Oxide-Semiconductor (PMOS) in parallel may be designed to improve the display gamma; or a NMOS may be designed to increase the width of the device so as to improve display reaction speed.

The present invention is described above in, but not limited to, the preferred embodiments. It is noted that those skilled in the art may make modifications and variations, without departing from the basic principle of the present invention; any of those modifications and variations shall fall into the protected scope of the present invention defined by the following claims.

What is claimed is:

1. A method for forming a liquid crystal display panel unit, comprising:
   providing a silicon substrate;
   forming a pixel switch circuit layer on the silicon substrate, the pixel switch circuit layer including a Metal-Oxide-Semiconductor Field Effect Transistor (MOSFET);
   forming a light shielding layer on the pixel switch circuit layer, wherein the light shielding layer prevents light from leaking into the MOSFET and is grounded;
   forming an insulation layer on the light shielding layer; and
   forming a micromirror layer on the insulation layer, wherein the micromirror layer reflects light and is electrically connected with a source of the MOSFET,
   wherein the micromirror layer, the insulation layer and the light shielding layer constitute a capacitor.

2. The method according to claim 1, further comprising: forming a mirror connecting pad isolated from the light shielding layer, wherein the mirror connecting pad and the light shielding layer are formed using the same material and with the same process, wherein the mirror connecting pad is electrically connected with the source of the MOSFET.

3. The method according to claim 2, further comprising: forming an opening in the insulation layer and filling the opening with a conductive material, wherein the conductive material electrically connects the micromirror layer to the mirror connecting pad.

4. The method according to claim 1, wherein the light shielding layer is electrically connected to a ground pad via a through hole in the pixel switch circuit layer; and the ground pad is grounded.

5. The method according to claim 1, wherein the insulation layer has a thickness ranging from 100 Å to 1000 Å.

6. The method according to claim 1, wherein the insulation layer is made of silicon oxide, silicon nitride, silicon oxynitride, hafnium oxide, aluminum oxide, zirconium oxide or a combination thereof.

7. The method according to claim 1, wherein the micromirror layer is made of aluminum.

8. The method according to claim 1, wherein the light shielding layer is made of metallic titanium, titanium nitride, AlCu alloy, titanium nitride or a combination thereof.

9. The method according to claim 2, further comprising: forming a silicon oxide layer on the light shielding layer and the mirror connecting pad prior to forming the insulation layer, wherein the silicon oxide layer fills the space between the shielding layer and the mirror connecting pad and has grooves on the surface corresponding to the space.

10. The method according to claim 9, further comprising forming an organic bottom anti-reflecting layer on the surface of the insulation layer to fill up the grooves on the surface of the insulation layer.

11. The method according to claim 10, further comprising partially removing the organic bottom anti-reflecting layer outside the grooves of the insulation layer.

12. The method according to claim 11, further comprising removing partially the silicon oxide layer by a dry etch process and planarizing the remaining silicon oxide layer until the light shielding layer is exposed.

13. The method according to claim 1, further comprising forming a liquid crystal layer on top of the micromirror layer.

* * * * *